(12) United States Patent
Pidutti et al.

(10) Patent No.: US 10,305,473 B2
(45) Date of Patent: May 28, 2019

(54) CONTROL CIRCUITRY FOR CONTROLLING A SET OF SWITCHES

(71) Applicant: Infineon Technologies AG, Neubiberg (DE)

(72) Inventors: Albino Pidutti, Villach (AT); Markus Ladurner, Villach (AT); Daniel Mayer, Ranten (AT)

(73) Assignee: Infineon Technologies AG, Neubiberg (DE)

( * ) Notice: Subject to any disclaimer, the term of this patent is extended or adjusted under 35 U.S.C. 154(b) by 51 days.

(21) Appl. No.: 15/454,956

(22) Filed: Mar. 9, 2017

(65) Prior Publication Data
US 2018/0262193 A1 Sep. 13, 2018

(51) Int. Cl.
| | | |
|---|---|---|
| H03B 1/00 | (2006.01) | |
| H03K 3/00 | (2006.01) | |
| H03K 17/687 | (2006.01) | |
| H02M 3/07 | (2006.01) | |
| H03K 17/12 | (2006.01) | |
| H02M 1/088 | (2006.01) | |
| H02M 1/44 | (2007.01) | |

(52) U.S. Cl.
CPC .......... H03K 17/6872 (2013.01); H02M 3/07 (2013.01); H03K 17/122 (2013.01); H02M 1/088 (2013.01); H02M 1/44 (2013.01)

(58) Field of Classification Search
CPC .............................. H03K 17/6872; H02M 3/07
USPC ...................................................... 327/109
See application file for complete search history.

(56) References Cited

U.S. PATENT DOCUMENTS

| | | | | |
|---|---|---|---|---|
| 6,353,309 B1* | 3/2002 | Ootani | .................... | G05F 1/575 323/282 |
| 6,930,473 B2* | 8/2005 | Elbanhawy | ......... | H02M 3/1584 323/282 |
| 2004/0008059 A1* | 1/2004 | Chen | ................. | H04L 25/03885 327/112 |
| 2013/0088278 A1* | 4/2013 | Spalding, Jr. | ...... | H03K 17/0822 327/401 |

OTHER PUBLICATIONS

"Profet TM+: Benchmark Robustness and Diagnostic in Modular Packages," retrieved from http://www.infineon.com/cms/en/product/power/smart-low-side-and-high-side-switches/high-side-switch, Infineon Technologies, Oct. 2011, 10 pp.
"Profet TM: Smart high-side switches, Product overview," retrieved from http://www.infineon.com/cms/en/product/power/smart-low-side-and-high-side-switches/high-side-switch/automotive-smart-high-side-switch-profet InfineonTechnologies, Mar. 2016, 16 pp.

* cited by examiner

*Primary Examiner* — Metasebia T Retebo
(74) *Attorney, Agent, or Firm* — Shumaker & Sieffert, P.A.

(57) ABSTRACT

In some examples, a device includes a set of switches configured to deliver current to an output node of the device, wherein the set of switches includes a first switch including a first control terminal and a second switch including a second control terminal, wherein a width-length ratio of the second switch is larger than a width-length ratio of the first switch, and wherein the first switch is electrically connected in parallel with the second switch. The device further includes control circuitry configured to deliver a first control signal to the first control terminal and deliver a second control signal to the second control terminal concurrently with delivering the first control signal to the first control terminal.

20 Claims, 7 Drawing Sheets

CONTROL CIRCUITRY FOR CONTROLLING A SET OF SWITCHES

TECHNICAL FIELD

This disclosure relates to power electronics.

BACKGROUND

A power electronics device may include a switch configured to conduct electricity between a power supply and a load. The power electronics device may also include control circuitry configured to control the electrical current through the switch by turning the switch on and off. The control circuitry may be configured to turn on the switch by delivering a control signal to a control terminal of the switch. The switch may not turn on instantaneously when the control circuitry begins delivering the control signal to the control terminal. Instead, the switch may turn on gradually in proportion to the electrical current of the control signal delivered by the control circuitry to the control terminal. The turn-on time of the switch may depend on the parasitic capacitances of the switch and the amplitude of the electrical current of the control signal.

SUMMARY

This disclosure describes techniques for a power electronics device including a set of switches connected in parallel and control circuitry configured to deliver control signals to the control terminals of the set of switches. The set of switches may replace a single switch, and the device may take advantage of the unique characteristics of each switch of the set of switches. By operating the set of switches in parallel, the power electronics device may experience similar turn-on times with a smaller control-circuitry footprint, as compared to other power electronics devices that have a single switch and the same package size.

In some examples, a device includes a set of switches configured to deliver current to an output node of the device, wherein the set of switches includes a first switch including a first control terminal and a second switch including a second control terminal, wherein a width-length ratio of the second switch is larger than a width-length ratio of the first switch, and wherein the first switch is electrically connected in parallel with the second switch. The device further includes control circuitry configured to deliver a first control signal to the first control terminal and deliver a second control signal to the second control terminal concurrently with delivering the first control signal to the first control terminal.

In some examples, a method includes delivering a first control signal to a control terminal of a first switch of a set of switches configured to deliver current to an output node. The method further includes delivering a second control signal to a control terminal of a second switch of the set of switches concurrently with delivering the first control signal to the control terminal of the first switch, wherein a width-length ratio of the second switch is larger than a width-length ratio of the first switch, and wherein the first switch is electrically connected in parallel with the second switch.

In some examples, a device comprising a single semiconductor package includes a set of switches configured to deliver current to an output pin of the device, wherein the set of switches includes a first switch including a first control terminal, a first high-side load terminal, and a first low-side load terminal. The set of switches also includes a second switch including a second control terminal, a second high-side load terminal electrically connected to the first high-side load terminal, and a second low-side load terminal electrically connected to the first low-side load terminal, wherein a width-length ratio of the second switch is larger than a width-length ratio of the first switch. The device further includes a power supply pin electrically connected to the first high-side load terminal and the second high-side load terminal, and the output pin electrically connected to the first low-side load terminal and the second low-side load terminal. The device includes control circuitry configured to deliver a first control signal to the first control terminal and deliver a second control signal to the second control terminal concurrently with delivering the first control signal to the first control terminal.

The details of one or more examples are set forth in the accompanying drawings and the description below. Other features, objects, and advantages will be apparent from the description and drawings, and from the claims.

DETAILED DESCRIPTION

Figure 1:
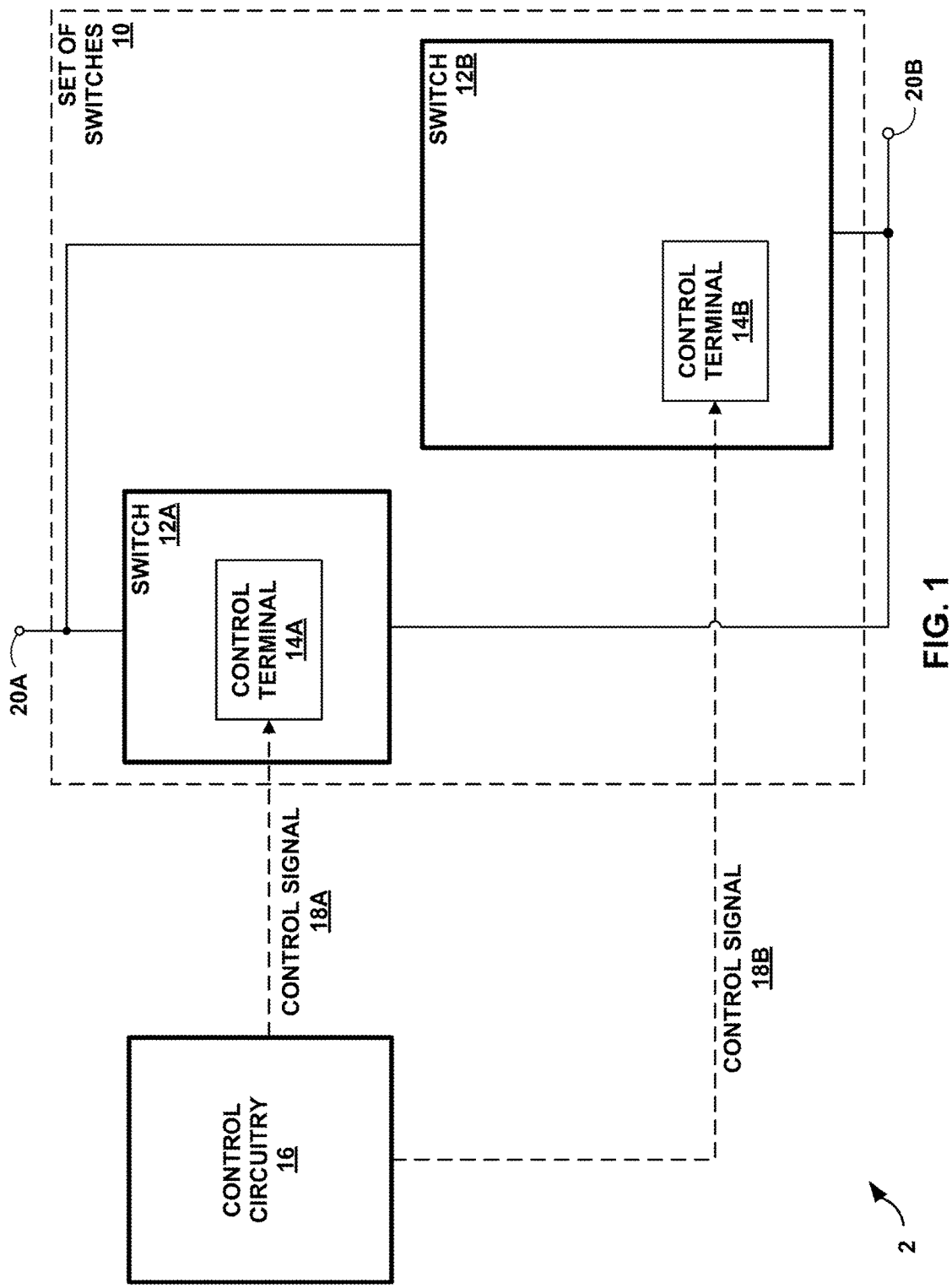
FIG. 1 is a conceptual block diagram illustrating a device including a set of switches connected in parallel and control circuitry, in accordance with some examples of this disclosure.

A power electronics device may include a switch configured to turn on and off during the operation of the device. Important characteristics of the device may include the power consumption of the device, the slew rate of the switch, and the size of the device package. First, the power consumption of the device may depend on the on-resistance of the switch, which may depend on the dimensions of the switch. Generally, a switch with a wide, short channel may have a lower on-resistance than a switch with a thin and/or long channel. Second, the slew rate of the switch may depend on the parasitic capacitances of the switch and the charging current delivered by the control circuitry. The parasitic capacitances of the switch may scale with the dimensions of the switch. Thus, a larger switch may include lower on-resistance but also higher parasitic capacitances and a lower slew rate, as compared to a smaller switch. Third, the size of the device package may be based on the size of the control circuitry. In some examples, the amplitude of the charging current (i.e., the control signal) delivered by the control circuitry to a control terminal of the switch may be proportional to the size of the charge-pump circuitry in the control circuitry.

A device of this disclosure may include smaller control circuitry, as compared to the control circuitry of other devices. The smaller size of the control circuitry may allow the device to have a smaller package size, which may allow the system, such as an electronics device or an electric motor control device, to have a smaller volume. The device may have a similar on-resistance and a similar slew rate, as compared to other devices, because the device includes a set of switches electrically connected in parallel. The set of switches may include a larger switch with a relatively low on-resistance and a smaller switch with relatively low parasitic capacitances. As a result, if the control circuitry delivers equal charging currents to the control terminals of the set the switches, the smaller switch may have a higher slew rate than the larger switch. Thus, the smaller switch may turn on more quickly than the larger switch.

In another device, a single switch may have larger dimensions to reduce the on-resistance of the switch and consequently reduce the power consumption of the device. Because of the larger dimensions, the single switch may have higher parasitic capacitances. To achieve an acceptable slew rate, the other device may include control circuitry with a relatively large footprint. The large footprint of the control circuitry may allow the control circuitry to produce a relatively high charging current, potentially causing the single switch to have an acceptable slew rate. However, the large footprint of the control circuitry may result in a large device package.

In contrast, a device of this disclosure with a set of switches connected in parallel may have a smaller package size and similar performance, as compared to the other device with a single switch. For example, the device may experience similar power consumption and slew rates, as compared to other devices with a single switch. The smaller switch of the set of switches may have lower parasitic capacitances and a faster slew rate, even for a relatively low charging current delivered by the control circuitry. The larger switch may have a lower on-resistance, lower power consumption, and higher current capability. Thus, the control circuitry may have a smaller footprint while still driving the smaller switch to have an acceptable slew rate. As a result, the device may provide acceptable performance in a smaller package, as compared to other devices.

FIG. 1 is a conceptual block diagram illustrating a device 2 including a set of switches 10 connected in parallel and control circuitry 16, in accordance with some examples of this disclosure. Device 2 includes set of switches 10, control circuitry 16, and nodes 20A and 20B. Device 2 may be a power electronics device, an analog electrical device, an embedded system, an integrated circuit (IC) device, a power conversion device, a motor driver circuit, and/or any other electrical device. Device 2 may be configured to drive an electrical load that is connected to output node 20B. The electrical load connected to output node 20B may be an electrical circuit, an electronic device, an electric motor, a light-producing device, a sound-producing device, and/or any other electrical load. In some examples, device 2 may receive a first form of electrical power at input node 20A and deliver a second form of electrical power at output node 20B. The first form of electrical power may be different than the second form of electrical power in frequency, waveform, current amplitude, and/or voltage amplitude.

Set of switches 10 includes switch 12A and switch 12B that are electrically connected in parallel. Set of switches 10 is configured to deliver an electrical current from input node 20A to output node 20B based on control signals 18A and 18B delivered by control circuitry 16 to control terminals 14A and 14B. The electrical current at output node 20B may be equal to a sum of the electrical current through switch 12A and the electrical current through switch 12B. As depicted in FIG. 1, switch 12A has a smaller area than switch 12B. Switch 12A may also have a smaller width-length ratio than switch 12B. The width of switch 12A is the width of the channel through which electricity flows between load terminals. For example, the width of the channel may be analogous to the number of lanes on a highway. The length of switch 12A is the length of the channel, i.e., how far the electricity has to travel between the load terminals. The length of the channel may be analogous to the distance between a starting point and a destination on a highway. Thus, a high width-length ratio may correspond to a low on-resistance because electricity has a relatively large amount of real estate through which to travel a relatively short distance.

In some examples, the width-length ratio of switch 12A may be twenty to one, thirty to one, or forty to one, and the width-length ratio of switch 12B may be twenty to one, sixty to one, or one hundred and twenty to one. The larger width-length ratio of switch 12B, as compared to switch 12A, may result in a lower on-resistance. In some examples, each of switches 12A and 12B may have the same length, and the width of switch 12B may be larger than the width of switch 12A. In some examples, each of switches 12A and 12B may include one or more switch modules, where the width of each of switches 12A and 12B may depend on the number of switch modules that are connected in parallel. For example, if the width-length ratio of switch 12A is five to one and the width-length ratio of switch 12B is twenty to one, switch 12B may include four times as many switch modules connected in parallel as switch 12A.

The power consumption of a switch, for example, may depend on the on-resistance of the switch. The power consumption may be the power dissipated in the switch as electricity flows between the load terminals. The power consumption may be based on equation (1), where P is the power consumption, V is the voltage between the load terminals of the switch, I is the electrical current between the load terminals, and R is the on-resistance of the switch. For a switch that conducts a specific electrical current I, the power consumption is proportion to the on-resistance R.

$$P=VI=V^2/R=I^2R \tag{1}$$

Switches 12A and 12B may be electrical connected in parallel such that the high-side load terminal of switch 12A may be electrically connected to the high-side load terminal of switch 12B. The low-side load terminal of switch 12A may be electrically connected to the low-side load terminal of switch 12B. In some examples, an electrical connection may be designed to have zero impedance between two or more components. In some examples, even though two components are designed to be electrically connected, there may be a nonzero electrical resistance and/or nonzero electrical impedance. In addition, an electrical connection between two components may include capacitance and/or inductance between the two components.

Switches 12A and 12B may be power switches such as, but not limited to, any type of field-effect transistor (FET), a bipolar junction transistor (BJT), an insulated-gate bipolar transistor (IGBT), a high-electron-mobility transistor (HEMT), a gallium-nitride (GaN) based transistor, or another element that uses voltage for its control. Switches 12A and 12B may include n-type transistors or p-type transistors and may be power transistors. In some examples, switches 12A and 12B may be vertical transistors, lateral transistors, and/or horizontal transistors. In some examples, switches 12A and 12B may include other analog devices such as diodes and/or thyristors. Switches 12A and 12B may also include a freewheeling diode connected in parallel with a transistor to prevent reverse breakdown of the transistor. In some examples, the switches 12A and 12B may operate as switches and/or as analog devices.

Switch 12A may include three terminals: two load terminals and control terminal 14A, and switch 12B may include three terminals: two load terminals and control terminal 14B. For MOSFET switches, switches 12A and 12B may include a drain terminal, a source terminal, and at least one gate terminal, where control terminals 14A and 14B are gate terminals. For BJT switches, control terminals 14A and 14B may be base terminals. Current may flow between the load terminals of switches 12A and 12B, based on the voltage at control terminals 14A and 14B. Therefore, electrical current may flow between nodes 20A and 20B based on control signals 18A and 18B delivered to control terminals 14A and 14B.

Switches 12A and 12B may include various material compounds, such as silicon (Si), silicon carbide (SiC), Gallium Nitride (GaN), or any other combination of one or more semiconductor materials. To take advantage of higher power density requirements in some circuits, power converters may operate at higher frequencies. In some examples, silicon carbide switches may experience lower switching power losses. Improvements in magnetics and faster switching, such as Gallium Nitride switches, may support higher frequency converters. These higher frequency circuits may require control signals to be sent with more precise timing, as compared to lower-frequency circuits.

Control circuitry 16 is configured to deliver control signals 18A and 18B to control terminals 14A and 14B to control the flow of electricity between the load terminals of switches 12A and 12B. Control circuitry 16 may include charge-pump circuitry that is configured to generate and deliver a charging current to control terminals 14A and 14B. The charge-pump circuitry of control circuitry 16 may include capacitors configured to store electrical charge during an off-period of switches 12A and 12B. At the beginning of the on-period of switches 12A and 12B, the charge-pump circuitry may release the electrical charge from the capacitors to control terminals 14A and 14B. To deliver a high-amplitude charging current, the charge-pump circuitry may include relatively large capacitors to store and release electrical charge.

Control circuitry 16 is configured to deliver control signal 18A to control terminal 14A concurrently with delivering control signal 18B to control terminal 14B. As used herein, "concurrently" means at the same time or approximately the same time, such that the enabling edge of control signal 18A occurs at the same time as the enabling edge of control signal 18B. In some examples, the enabling edges of control signals 18A and 18B may be the rising edges or the falling edges. In some examples, the rising edge of control signal 18A may be a small duration of time different than the rising edge of control signal 18B, such as ten percent of the total time period of a cycle for control signal 18A or control signal 18B, wherein the total time period for a control signal includes a high period and a low period. The time difference between the rising edges and/or falling edges may be due to the difference in parasitic capacitances of switches 12A and 12B and/or the characteristics of controls 18A and 18B. For example, if the switching frequency of control signals 18A and 18B is five kilohertz, then the total time period is two hundred microseconds, and the rising edges of control signals 18A and 18B may occur concurrently, which is defined as within twenty microseconds of each other.

Control signals 18A and 18B may be square waveforms with an enabling period and a non-enabling period. The enabling period of control signal 18A, for example, may be the period of time during which control signal 18A enables switch 12A to conduct electricity between the load terminals of switch 12A. Control signal 18A may include a charging current that is a flow of electricity to or from control terminal 14A. As electrical charge accumulates or leaves control terminal 14A, the voltage difference between control terminal 14A and output node 20B may increase or decrease. This voltage difference may be a gate-source voltage or a base-emitter voltage, depending on the type of switch.

The rate at which the voltage at control terminal 14A increases or decreases is known as the slew rate and is measured in volts per second. The turn-on time of switch 12A is the reaction time of switch 12A to an enabling signal from control circuitry 16. When control terminal 14A receives an enabling rising edge or an enabling falling edge of control signal 18A, switch 12A may transition from zero or almost zero electrical current to a desired electrical current. The turn-on time may be the time duration between the enabling edge of control signal 18A and the desired electrical current or some percentage of the desired electrical current. The turn-on time may be based on the slew rate, such that a fast slew rate causes switch 12A to turn on quickly. A fast, or short, turn-on time may cause switch 12A to conduct a desired electrical current in a short time duration after the beginning of an enabling period of control signal 18A. In the example of FIG. 1, control signal 18A may cause the voltage at control terminal 14A to change at a faster slew rate, as compared to the slew rate of the voltage at control terminal 14B caused by control signal 18B.

The slew rate of a switch may depend on the parasitic capacitances of the switch. In some examples, a switch with a large cross-sectional area may have relatively high parasitic capacitances and a relatively low slew rate. The parasitic capacitances of switch 12A may include a gate-drain capacitance, a gate-source capacitance, and a drain-source capacitance if switch 12A is a MOSFET switch. To increase the slew rate of a switch with relatively high parasitic capacitances, control circuitry 16 may be enlarged to deliver a higher-amplitude charging current to the control terminal of the switch. However, the size of the package of device 2 may be based at least partially on the size of control circuitry 16.

In accordance with the techniques of this disclosure, the size of the package of device 2 may be reduced while maintaining the performance characteristics of device 2. When control circuitry 16 concurrently delivers control signals 18A and 18B, switch 12A may turn on more quickly than switch 12B turns on. For example, device 2 may experience satisfactory slew rates because of the smaller parasitic capacitances of switch 12A. Device 2 may also experience satisfactory power consumption because of the lower on-resistance of switch 12B. As compared to another device with a single switch, a package size of device 2 may be smaller because of the smaller area of control circuitry 16.

Device 2 may have better performance at higher temperatures, as compared to another device with a single switch. The risk of thermal runaway and current crowding may be lower in device 2, as compared to another device with a single switch. Device 2 may operate with a higher current density during current limitations events, which may allow operation above a temperature stable point.

Figure 2:
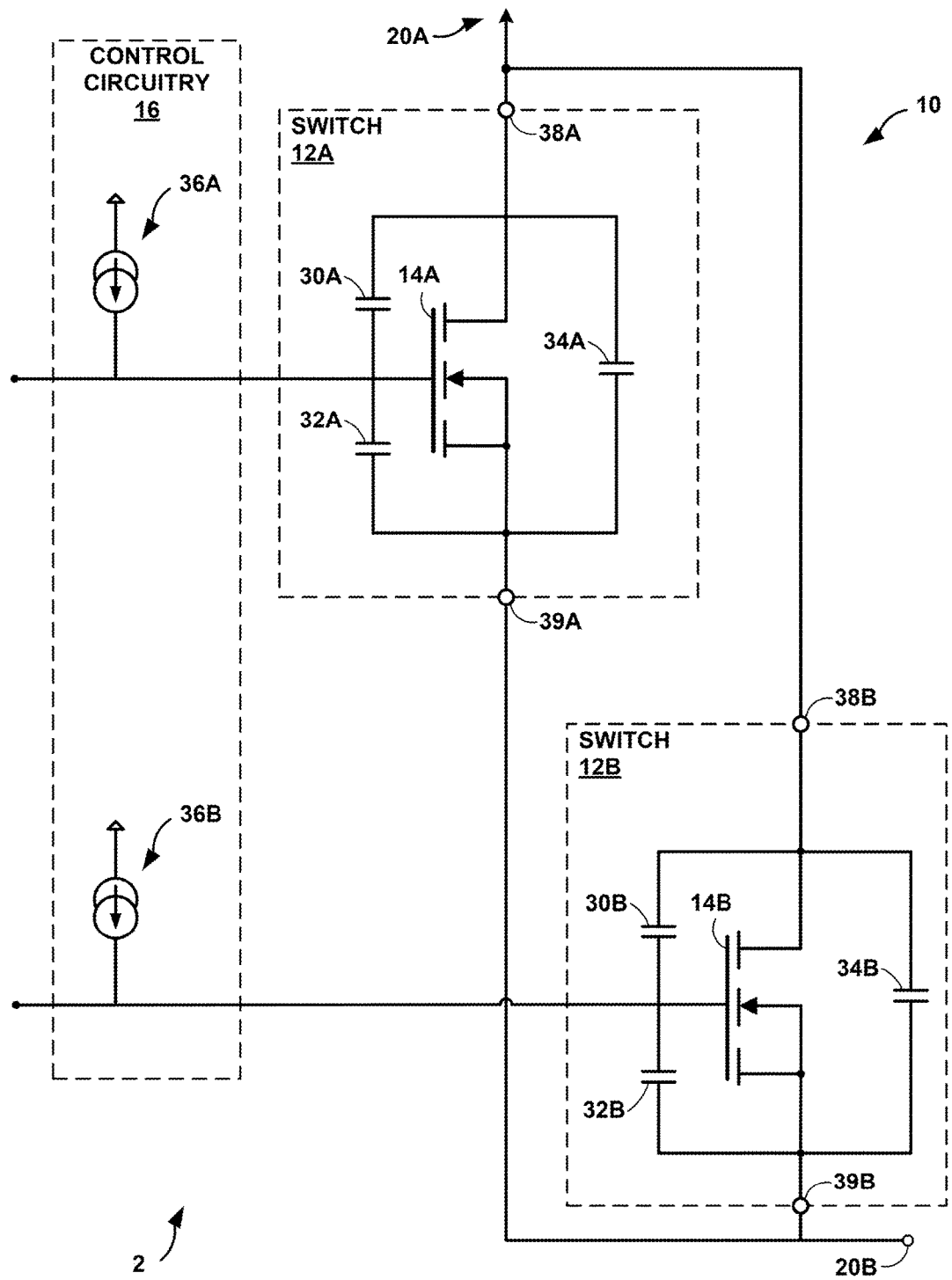
FIG. 2 is a circuit diagram illustrating the device of FIG. 1 including the parasitic capacitances of the set of switches, in accordance with some examples of this disclosure.

FIG. 2 is a circuit diagram illustrating device 2 of FIG. 1 including parasitic capacitances 30A, 30B, 32A, 32B, 34A, and 34B of set of switches 10, in accordance with some examples of this disclosure. Switch 12A includes gate-drain parasitic capacitance 30A, gate-source parasitic capacitance 32A, and drain-source parasitic capacitance 34A. Switch 12B includes gate-drain parasitic capacitance 30B, gate-source parasitic capacitance 32B, and drain-source parasitic capacitance 34B. Gate-drain capacitance 30A may be less than the gate-drain capacitance 30B because switch 12A may be smaller than switch 12B. Switch 12A may be have a faster turn-on time than switch 12B if gate-drain capacitance 30A is less than the gate-drain capacitance 30B.

Parasitic capacitances 30A, 30B, 32A, 32B, 34A, and 34B may not be actual capacitors. Instead, parasitic capacitances 30A, 30B, 32A, 32B, 34A, and 34B may be stray capacitance caused by the electric fields generated by electrical charges in the drain terminal, source terminal, and/or gate terminal. Parasitic capacitances 30A, 30B, 32A, 32B, 34A, and 34B may be more important at higher frequencies, such as during the turning on or turning off transitions of switch 12A and/or switch 12B.

In some examples, switches 12A and 12B may be a part of a single semiconductor die. Each of switches 12A and 12B may have a separate control terminal, but control terminals 14A and 14B may be adjacent. In some examples, control terminals 14A and 14B may be interleaved, such that each control terminal has multiple segments. One segment of control terminal 14A may be bounded by a first segment of control terminal 14B on one side and a second segment of control terminal 14B.

Input node 20A may be electrically connected to high-side load terminals 38A and 38B of switches 12A and 12B and to power supply circuitry (not shown in FIG. 2). Input node 20A may also be electrically connected to a power supply pin, which may connect to a power source that is external to device 2. The power supply circuitry may receive electrical power from outside of device 2, such as from an electrical grid or another power source. Output node 20B may be electrically connected to low-side load terminals 39A and 39B of switches 12A and 12B and to an electrical load.

Control circuitry 16 may include current sources 36A and 36B, which may include charge-pump circuitry. The charge-pump circuitry may include capacitors configured to store electrical charge during an off-period of switches 12A and 12B. At the beginning of the on-period of switches 12A and 12B, the charge-pump circuitry may release the electrical charge from the capacitors to control terminals 14A and 14B. In some examples, the charging current of current sources 36A and 36B may be approximately seventy microamperes. In contrast, the charging current of another device with a single switch and a similar slew rate may be one hundred and five microamperes. The other device may include larger control circuitry, and consequently a larger package, to generate the larger charging current.

The charge-pump circuitry of control circuitry 16 may operate based on a clock frequency. During its operation, the charge-pump circuitry may generate electromagnetic interference (EMI) that may affect the performance of other components in device 2 and components that are outside of device 2. Moreover, the charge-pump circuitry may operate based on a clock frequency. In general, a higher clock frequency for the charge-pump circuitry may result in higher amounts of EMI. The techniques of this disclosure may allow a reduced clock frequency for the charge-pump circuitry, and therefore lower amounts of EMI, without sacrificing the performance of device 2. A reduced clock frequency may cause the efficiency and the EMI of the charge-pump circuitry to decline. Device 2 may achieve satisfactory performance and lower EMI with lower-efficiency charge-pump circuitry, as compared to another device with a single switch.

Figure 3:
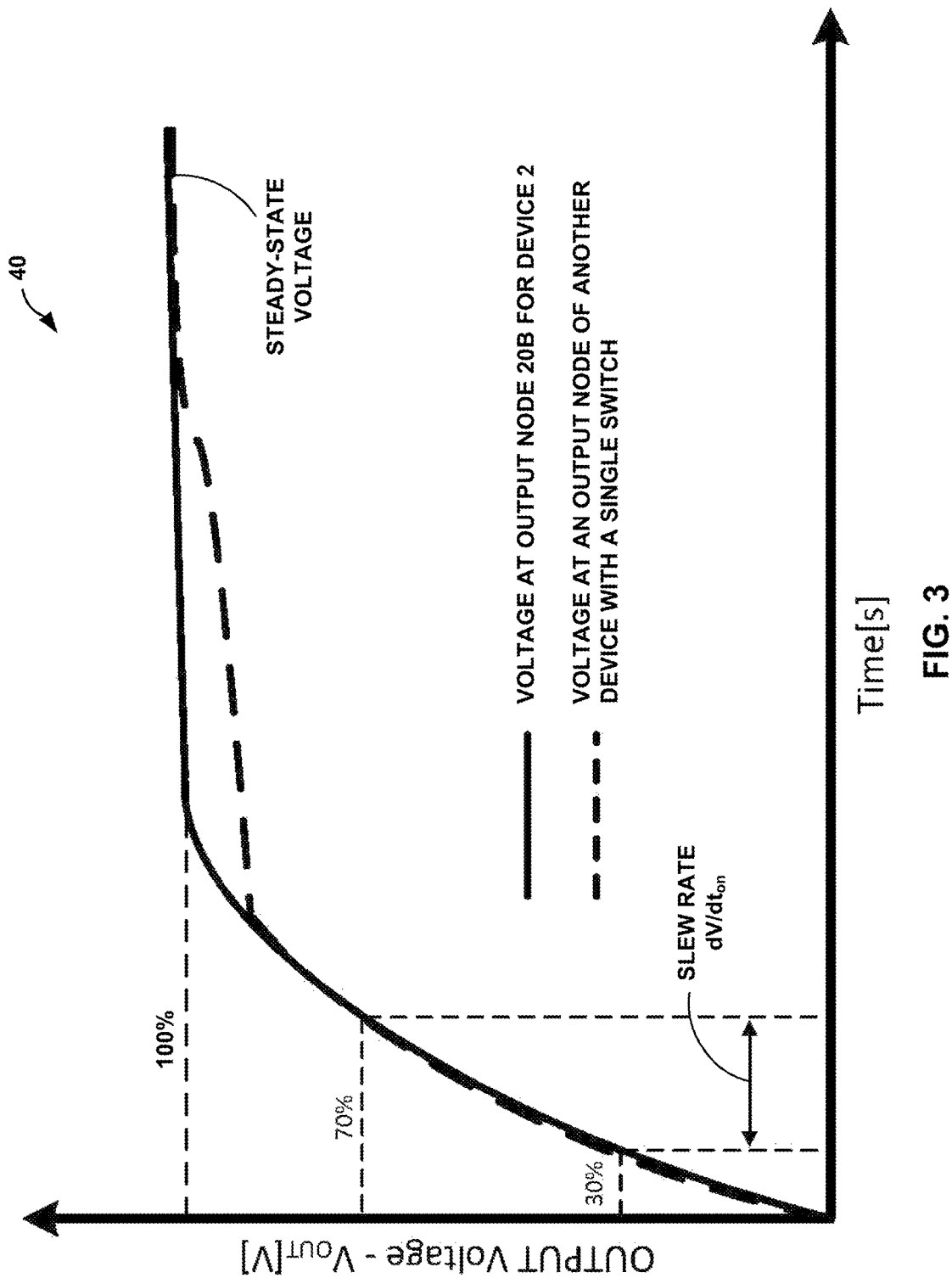
FIG. 3 is a graph of the output voltage of the set of switches of FIG. 1, in accordance with some examples of this disclosure.

FIG. 3 is a graph 40 of the output voltage of set of switches 10 of FIG. 1, in accordance with some examples of this disclosure. Graph 40 depicts the turn-on transition for the voltage at output node 20B as control circuitry 16 delivers control signals 18A and 18B to control terminals 14A and 14B. In some examples, the slew rate of the voltage at output node 20B, as depicted in graph 40, may be different than the slew rate of the voltage at control terminal 14A or 14B. The slew rate of the voltage at output node 20B may be measured from thirty percent of the steady-state voltage to seventy percent of the steady-state voltage. The slew rate for device 2 may be approximately equal to the slew rate for another device with a larger-sized control circuitry, but device 2 may have a smaller package size and lower amounts of EMI.

TABLE I

Comparison of three devices.

| Scenario | Control signal amplitude | Slew rate (mV/µs) | Switching losses (µJ) |
|---|---|---|---|
| Single switch | 105 µA | 650 mV/µs | 286 µJ |
| Single switch | 70 µA | 433 mV/µs | 402 µJ |
| Set of switches | 70 µA | 650 mV/µs | 327 µJ |

Table I shows three possible configurations for a device including at least one switch. The first scenario is another device with a single switch designed to have an acceptable slew rate of six hundred and fifty millivolts per microsecond. However, the first scenario also includes a control signal with a higher amplitude, which may result in a larger device package and higher EMI. The second scenario is another device with a single switch designed for a control signal with a lower amplitude of seventy microamperes. However, the second scenario also includes a lower slew rate, which may result in a slower turn-on time for the single switch. The third scenario is an example of device 2 with set of switches 10, which has an acceptable slew rate and control signals with a lower amplitude. The switching losses for the example of device 2 are higher than the first scenario but lower than the second scenario. However, the slight increase in switching losses from the first scenario to device 2 may be balanced by the other benefits described herein.

Figure 4:
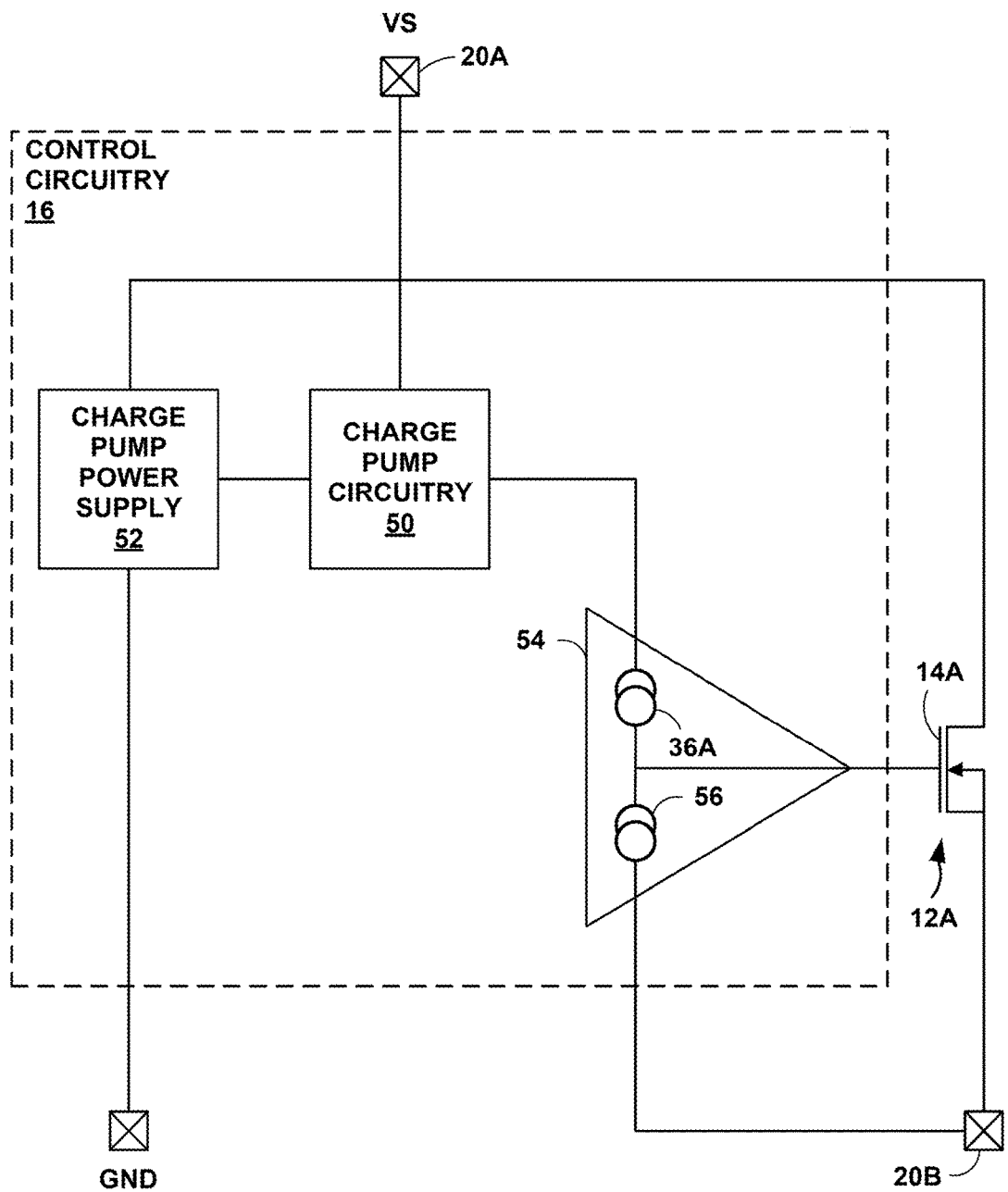
FIG. 4 is a conceptual block and circuit diagram illustrating the device of FIG. 1, in accordance with some examples of this disclosure.

FIG. 4 is a conceptual block and circuit diagram illustrating device 2 of FIG. 1, in accordance with some examples of this disclosure. FIG. 4 depicts charge-pump circuitry 50, charge pump power supply 52, and gate driver circuitry 54 of control circuitry 16. Charge-pump circuitry 50, charge pump power supply 52, and a high-side load terminal of switch 12A may be electrically connected to input node 20A and/or power supply circuitry for device 2. Gate driver circuitry 54 may deliver control signal 18A based on current sources 36A and 56. Charge-pump circuitry 50 may drive current source 36A to deliver an electrical current to control terminal 14A. Current source 56 may deliver an electrical current from output node 20B to control terminal 14A.

Figure 5:
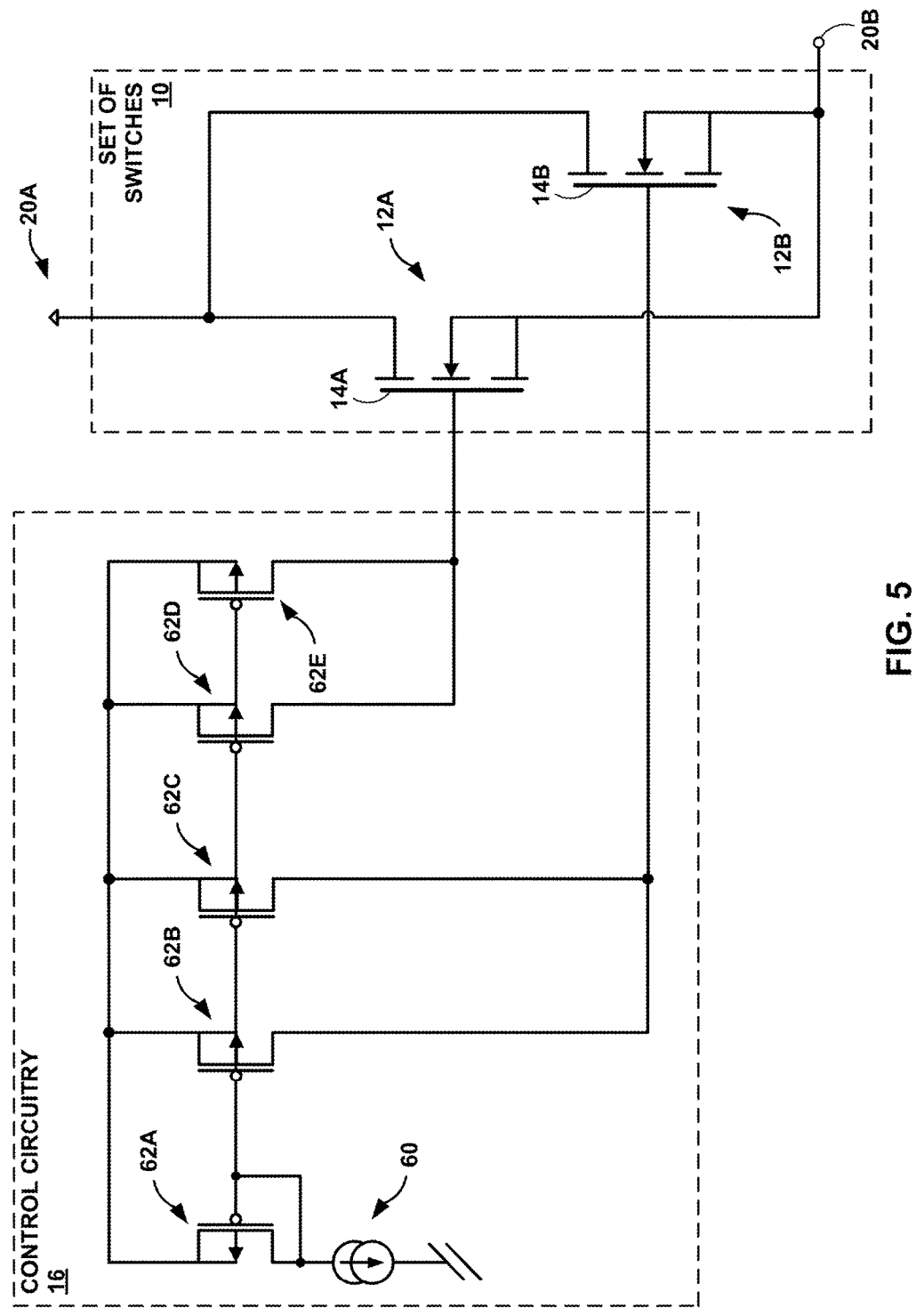
FIG. 5 is a circuit diagram illustrating the device of FIG. 1 including an example configuration of the control circuitry, in accordance with some examples of this disclosure.

FIG. 5 is a circuit diagram illustrating device 2 of FIG. 1 including an example configuration of control circuitry 16, in accordance with some examples of this disclosure. Control circuitry 16 may include biasing current source 60 and control switches 62A-62E operating as a current mirror. In some examples, set of control switches 62B and 62C may operate as current source 36B to deliver an electrical current to control terminal 14B, and set of control switches 62D and 62E may operate as current source 36A to deliver an electrical current to control terminal 14A. In the control circuitry of another device, control switches 62B-62E may be configured to deliver a control signal to the control terminal of a single switch. To change the design from a single switch to two switches 12A and 12B, the layout of control switches 62B-62E may remain the same or similar, but the load terminals of control switches 62B and 62C may be connected to control terminal 14B, and the load terminals of control switches 62D and 62E may be connected to control terminal 14A. Thus, redesigning another device with a single switch to device 2 with set of switches 10

Set of control switches 62B and 62C may be configured to conduct electricity from power supply circuitry (not shown in FIG. 5) to control terminal 14B. Set of control switches 62D and 62E may be configured to conduct electricity from the power supply circuitry to control terminal 14A. The power supply circuitry may also be electrically connected to input node 20A and the high-side load terminals of switches 12A and 12B.

Figure 6:
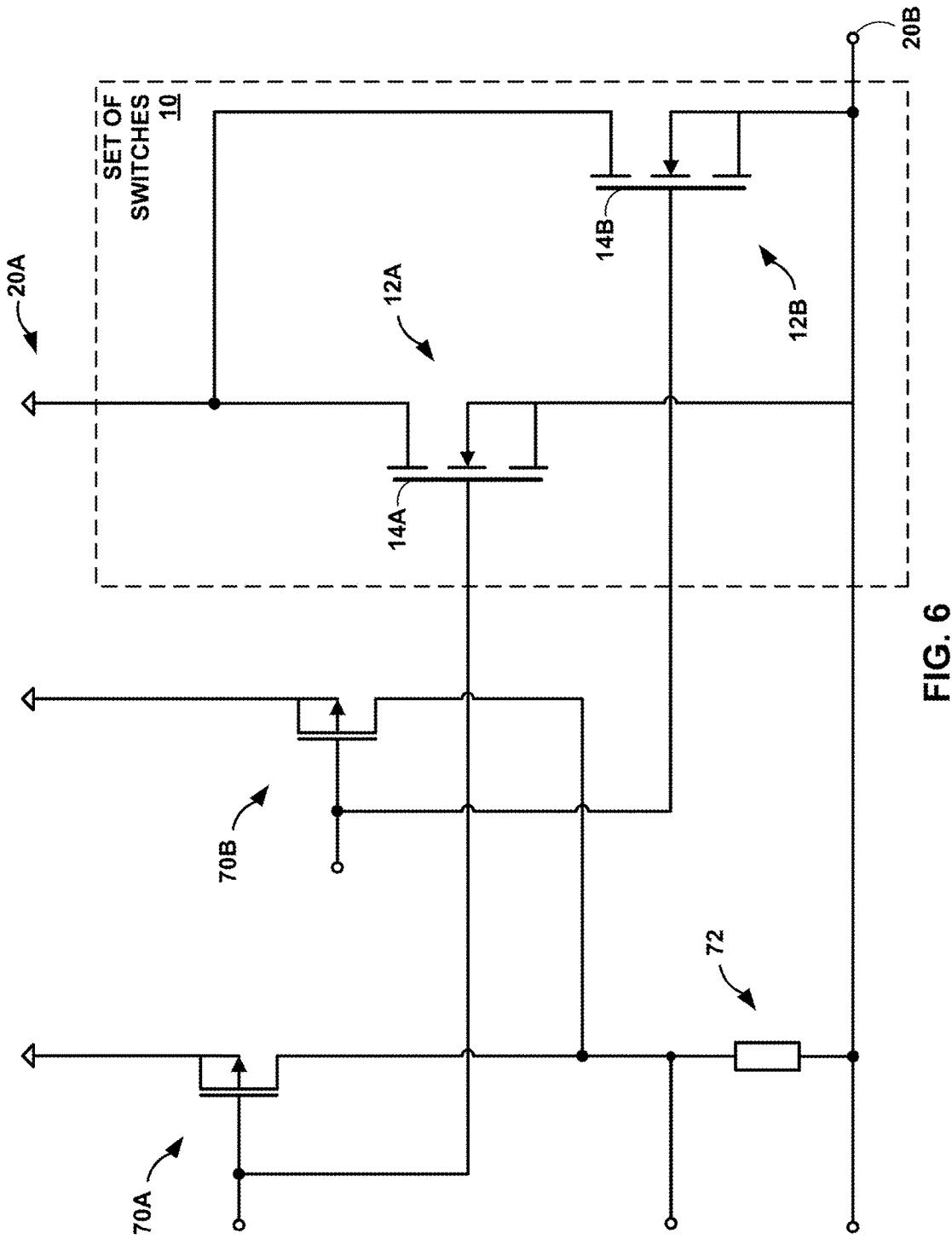
FIG. 6 is a circuit diagram illustrating the device of FIG. 1 including sensing circuitry configured to sense an electrical current through the set of switches, in accordance with some examples of this disclosure.

FIG. 6 is a circuit diagram illustrating device 2 of FIG. 1 including sensing circuitry configured to sense an electrical current through set of switches 10, in accordance with some examples of this disclosure. The example sensing circuitry of FIG. 6 includes sensing switch 70A configured to mirror a current density of switch 12A and sensing switch 70B configured to mirror a current density of switch 12B. Both of switches 70A and 70B may be configured to conduct electrical current. Both of switches 70A and 70B may be electrically connected in series with sensing resistor 72 such that the electrical current through switches 70A and 70B travels through sensing resistor 72. The sensing circuitry may be configured to measure the voltage across sensing resistor 72 as an indication of the electrical current through set of switches 10.

Figure 7:
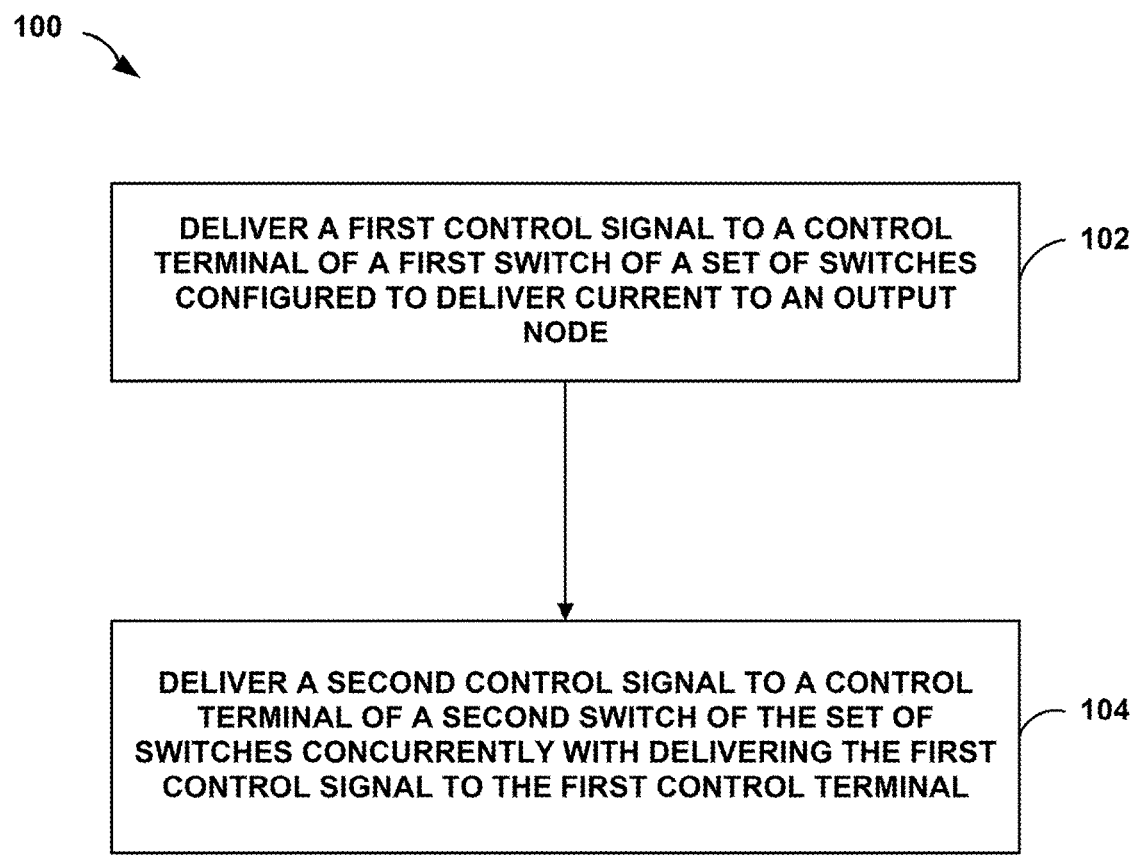
FIG. 7 is a flowchart illustrating a technique for controlling a set of switches, in accordance with some examples of this disclosure.

FIG. 7 is a flowchart illustrating a technique 100 for controlling a set of switches, in accordance with some examples of this disclosure. Technique 100 is described with reference to device 2 in FIGS. 1-6, although other components may exemplify similar techniques.

The technique of FIG. 7 includes delivering control signal 18A to control terminal 14A of switch 12A of set of switches 10 (102). Set of switches 10 is connected in parallel and is configured to deliver an electrical current to from input node 20A to output node 20B. The combined turn-on time of set of switches 10 may be defined by the turn-on time of switch 12A because switch 12A may turn on more quickly than switch 12B. The turn-on time of switch 12A caused by control signal 18A may be shorter than a turn-on time of switch 12B caused by control signal 18B. Switch 12A may turn on more quickly as a result of the higher slew rate of the voltage at control terminal 14A, as compared to the slew rate of the voltage at control terminal 14B. The combined turn-on time of set of switches 10 may be defined as the time between the beginning of the enabling periods of control signals 18A and 18B and the voltage at output node 20B reaching a particular level, such as thirty percent, fifty percent, or seventy percent of a steady-state voltage.

The technique of FIG. 7 also includes delivering control signal 18B to control terminal 14B of switch 12B of set of switches 10 concurrently with delivering control signal 18A to control terminal 14A. The width-length ratio of switch 12B may be larger than the width-length ratio of switch 12A, such that the on-resistance of switch 12A may be greater than the on-resistance of switch 12B. Therefore, combined on-resistance of set of switches 10 may be defined by an on-resistance of switch 12B, such that the combined on-resistance of set of switches 10 may be within ten percent, twenty percent, or thirty percent of the on-resistance of switch 12B.

Delivering control signals 18A and 18B concurrently to set of switches 10 may result in a similar slew rate, turn-on time, and on-resistance, as compared to another device with a single switch. Device 2 may have a smaller package size due to the smaller size of control circuitry 16, as compared to the other device with a single switch. In addition, device 2 may experience lower EMI by operating control circuitry 16 at a slower clock frequency.

In some examples, device 2 may include a second set of switches that are connected in parallel. Device 2 may also include a second control circuitry configured to control the electrical current through the second set of switches to a second output node. The second set of switches may deliver electrical current through the second output node to a second electrical load. Device may include the two sets of switches and the two control circuitries in a single semiconductor package. The second set of switches may include a switch with a larger width-length ratio and a lower on-resistance than the other switch of the second set of switches. The other switch of the second set of switches may have lower parasitic capacitances and a faster turn-on time than the switch with the larger width-length ratio. In some examples, both sets of switches of device 2 may receive electrical power from the same power supply circuitry and/or from input node 20A.

The following numbered examples demonstrate one or more aspects of the disclosure.

Example 1

A device includes a set of switches configured to deliver current to an output node of the device, wherein the set of switches includes a first switch including a first control terminal and a second switch including a second control terminal, wherein a width-length ratio of the second switch is larger than a width-length ratio of the first switch, and wherein the first switch is electrically connected in parallel with the second switch. The device further includes control circuitry configured to deliver a first control signal to the first control terminal and deliver a second control signal to the second control terminal concurrently with delivering the first control signal to the first control terminal.

Example 2

The device of example 1, wherein a turn-on time of the first switch caused by the first control signal is shorter than a turn-on time of the second switch caused by the first control signal.

Example 3

The device of examples 1-2 or any combination thereof, wherein a slew rate of a voltage at the first control terminal based on the first control signal is higher than a slew rate of a voltage at the second control terminal based on the second control signal.

Example 4

The device of examples 1-3 or any combination thereof, wherein an amplitude of an electrical current of the first control signal is equal to an amplitude of an electrical current of the second control signal.

Example 5

The device of examples 1-4 or any combination thereof, wherein an on-resistance of the first switch is greater than an on-resistance of the second switch.

Example 6

The device of examples 1-5 or any combination thereof, further including power supply circuitry, wherein a high-side load terminal of the first switch and a high-side load terminal of the second switch are electrically connected to the power supply circuitry, and wherein a low-side load terminal of the first switch is electrically connected to a low-side load terminal of the second switch.

Example 7

The device of examples 1-6 or any combination thereof, wherein the set of switches is a set of power switches, and wherein the control circuitry includes a first set of one or more control switches configured to conduct electricity from the power supply circuitry to the first control terminal. The control circuitry further includes and a second set of one or more control switches configured to conduct electricity from the power supply to the second control terminal, wherein the power supply circuitry is electrically connected to a high-side load terminal of the first switch and a high-side load terminal of the second switch.

Example 8

The device of examples 1-7 or any combination thereof, wherein the output node is electrically connected to the low-side load terminal of the first switch and the low-side load terminal of the second switch, and wherein the electrical current at the output node is equal to a sum of an electrical current through the first switch and an electrical current through the second switch.

Example 9

The device of examples 1-8 or any combination thereof, wherein the set of switches is a first set of switches, wherein the output node is a first output node, and wherein the control circuitry is first control circuitry, the device further including a single semiconductor package including the first set of switches, the first control circuitry, and a second set of switches configured to deliver current to a second output node of the device. The single semiconductor package further includes second set of switches includes a third switch including a third control terminal and a fourth switch including a fourth control terminal, wherein a width-length ratio of the fourth switch is larger than a width-length ratio of the third switch, wherein the third switch is electrically connected in parallel with the fourth switch. The device also includes second control circuitry is configured to deliver a third control signal to the third control terminal and deliver a fourth control signal to the fourth control terminal concurrently with delivering the third control signal to the third control terminal.

Example 10

The device of examples 1-9 or any combination thereof, wherein a gate-drain capacitance of the first switch is less than a gate-drain capacitance of the second switch.

Example 11

The device of examples 1-10 or any combination thereof, wherein a combined turn-on time of the set of switches is defined by a turn-on time of the first switch, wherein a combined on-resistance of the set of switches is defined by an on-resistance of the second switch.

Example 12

The device of examples 1-11 or any combination thereof, wherein the first control signal causes the voltage at the first control terminal to change at a first slew rate, wherein the second control signal causes the voltage at the second control terminal to change at a second slew rate, and wherein the first slew rate is higher than the second slew rate.

Example 13

A method includes delivering a first control signal to a control terminal of a first switch of a set of switches configured to deliver current to an output node. The method further includes delivering a second control signal to a control terminal of a second switch of the set of switches concurrently with delivering the first control signal to the control terminal of the first switch, wherein a width-length ratio of the second switch is larger than a width-length ratio of the first switch, and wherein the first switch is electrically connected in parallel with the second switch.

Example 14

The method of example 13, wherein a turn-on time of the first switch caused by delivering the first control signal is shorter than a turn-on time of the second switch caused by delivering the second control signal.

Example 15

The method of examples 13-14 or any combination thereof, wherein a slew rate of a voltage at the first control terminal caused by delivering the first control signal is higher than a slew rate of a voltage at the second control terminal caused by delivering the second control signal.

Example 16

The method of examples 13-15 or any combination thereof, wherein an on-resistance of the first switch is greater than an on-resistance of the second switch, and wherein a gate-drain capacitance of the first switch is less than a gate-drain capacitance of the second switch.

Example 17

A device comprising a single semiconductor package includes a set of switches configured to deliver current to an output pin of the device, wherein the set of switches includes a first switch including a first control terminal, a first high-side load terminal, and a first low-side load terminal. The set of switches also includes a second switch including a second control terminal, a second high-side load terminal electrically connected to the first high-side load terminal, and a second low-side load terminal electrically connected to the first low-side load terminal, wherein a width-length ratio of the second switch is larger than a width-length ratio of the first switch. The device further includes a power supply pin electrically connected to the first high-side load terminal and the second high-side load terminal, and the output pin electrically connected to the first low-side load terminal and the second low-side load terminal. The device includes control circuitry configured to deliver a first control signal to the first control terminal and deliver a second control signal to the second control terminal concurrently with delivering the first control signal to the first control terminal.

Example 18

The device of example 17, wherein a turn-on time of the first switch caused by the first control signal is shorter than a turn-on time of the second switch caused by the second control signal.

Example 19

The device of examples 17-18 or any combination thereof, wherein an on-resistance of the first switch is greater than an on-resistance of the second switch, and wherein a gate-drain capacitance of the first switch is less than a gate-drain capacitance of the second switch.

Example 20

The device of examples 17-19 or any combination thereof, wherein the set of switches is a set of power switches, and wherein the control circuitry includes a first set of one or more control switches configured to conduct electricity from the power supply pin to the first control terminal. The control circuitry also includes a second set of one or more control switches configured to conduct electricity from the power supply pin to the second control terminal.

Example 21

The device of examples 17-20 or any combination thereof, wherein a slew rate of a voltage at the first control terminal based on the first control signal is higher than a slew rate of a voltage at the second control terminal based on the second control signal.

Various examples of the disclosure have been described. Any combination of the described systems, operations, or functions is contemplated. These and other examples are within the scope of the following claims.

What is claimed is:

1. A device comprising:
    a set of power switches configured to deliver current to an output node of the device, wherein the set of power switches includes:
        a first switch including a first control terminal; and
        a second switch including a second control terminal, wherein a width-length ratio of the second switch is larger than a width-length ratio of the first switch, and
        wherein the first switch is electrically connected in parallel with the second switch;
    power supply circuitry; and
    control circuitry comprising:
        a first set of one or more control switches configured to deliver a first control signal to the first control terminal by conducting electricity from the power supply circuitry to the first control terminal; and
        a second set of one or more control switches configured to deliver a second control signal to the second control terminal concurrently with delivering the first control signal to the first control terminal,
        wherein the second set of one or more control switches is configured to deliver the second control signal by conducting electricity from the power supply circuitry to the first control terminal, and
        wherein the first set of one or more control switches and the second set of one or more control switches are configured to operate as a current mirror.

2. The device of claim 1, wherein a turn-on time of the first switch caused by the first control signal is shorter than a turn-on time of the second switch caused by the first control signal.

3. The device of claim 1, wherein a slew rate of a voltage at the first control terminal based on the first control signal is higher than a slew rate of a voltage at the second control terminal based on the second control signal.

4. The device of claim 1, wherein an amplitude of an electrical current of the first control signal is equal to an amplitude of an electrical current of the second control signal.

5. The device of claim 1, wherein an on-resistance of the first switch is greater than an on-resistance of the second switch.

6. The device of claim 1,
    wherein the power supply circuitry is electrically connected to a high-side load terminal of the first switch and a high-side load terminal of the second switch,
    wherein a low-side load terminal of the first switch is electrically connected to a low-side load terminal of the second switch,
    wherein the output node is electrically connected to the low-side load terminal of the first switch and the low-side load terminal of the second switch, and
    wherein the electrical current at the output node is equal to a sum of an electrical current through the first switch and an electrical current through the second switch.

7. The device of claim 1, wherein a gate-drain capacitance of the first switch is less than a gate-drain capacitance of the second switch.

8. The device of claim 1, wherein a combined turn-on time of the set of one or more control switches is defined by a turn-on time of the first switch, wherein a combined on-resistance of the set of one or more control switches is defined by an on-resistance of the second switch.

9. The device of claim 1, wherein the first control signal causes the voltage at the first control terminal to change at a first slew rate, wherein the second control signal causes the voltage at the second control terminal to change at a second slew rate, and wherein the first slew rate is higher than the second slew rate.

10. The device of claim 1,
    wherein the first set of one or more control switches is configured to deliver a rising edge of the first control signal, and
    wherein the second set of one or more control switches is configured to deliver a rising edge of the second control signal concurrently with the first set of one or more control switches delivering the rising edge of the first control signal.

11. The device of claim 1,
wherein the first set of one or more control switches is configured to deliver a falling edge of the first control signal, and
wherein the second set of one or more control switches is configured to deliver a falling edge of the second control signal concurrently with the first set of one or more control switches delivering the falling edge of the first control signal.

12. A method comprising:
delivering, by a first set of one or more control switches, a first control signal to a control terminal of a first switch of a set of power switches configured to deliver current to an output node, wherein delivering the first control signal comprises conducting electricity from power supply circuitry to the first control terminal;
delivering, by a second set of one or more control switches, a second control signal to a control terminal of a second switch of the set of power switches concurrently with delivering the first control signal to the control terminal of the first switch,
wherein delivering the second control signal comprises conducting electricity from the power supply circuitry to the second control terminal,
wherein the first set of one or more control switches and the second set of one or more control switches are configured to operate as a current mirror, and
wherein a width-length ratio of the second switch is larger than a width-length ratio of the first switch, and wherein the first switch is electrically connected in parallel with the second switch.

13. The method of claim 12, wherein a turn-on time of the first switch caused by delivering the first control signal is shorter than a turn-on time of the second switch caused by delivering the second control signal.

14. The method of claim 12, wherein a slew rate of a voltage at the first control terminal caused by delivering the first control signal is higher than a slew rate of a voltage at the second control terminal caused by delivering the second control signal.

15. The method of claim 12, wherein an on-resistance of the first switch is greater than an on-resistance of the second switch, and wherein a gate-drain capacitance of the first switch is less than a gate-drain capacitance of the second switch.

16. A device comprising a single semiconductor package including:
a set of power switches configured to deliver current to an output pin of the device, wherein the set of power switches includes:
a first switch including:
a first control terminal,
a first high-side load terminal, and
a first low-side load terminal; and
a second switch including:
a second control terminal,
a second high-side load terminal electrically connected to the first high-side load terminal, and
a second low-side load terminal electrically connected to the first low-side load terminal, wherein a width-length ratio of the second switch is larger than
a width-length ratio of the first switch;
a power supply pin electrically connected to the first high-side load terminal and the second high-side load terminal;
the output pin electrically connected to the first low-side load terminal and the second low-side load terminal; and
control circuitry comprising:
a first set of one or more control switches configured to deliver a first control signal to the first control terminal by conducting electricity from the power supply circuitry to the first control terminal: and
a second set of one or more control switches configured to deliver a second control signal to the second control terminal concurrently with delivering the first control signal to the first control terminal,
wherein the second set of one or more control switches is configured to deliver the second control signal by conducting electricity from the power supply circuitry to the first control terminal, and
wherein the first set of one or more control switches and the second set of one or more control switches are configured to operate as a current mirror.

17. The device of claim 16, wherein a turn-on time of the first switch caused by the first control signal is shorter than a turn-on time of the second switch caused by the second control signal.

18. The device of claim 16, wherein an on-resistance of the first switch is greater than an on-resistance of the second switch, and wherein a gate-drain capacitance of the first switch is less than a gate-drain capacitance of the second switch.

19. The device of claim 16,
wherein the first set of one or more control switches is configured to deliver a rising edge of the first control signal, and
wherein the second set of one or more control switches is configured to deliver a rising edge of the second control signal concurrently with the first set of one or more control switches delivering the rising edge of the first control signal.

20. The device of claim 16,
wherein the first set of one or more control switches is configured to deliver a falling edge of the first control signal, and
wherein the second set of one or more control switches is configured to deliver a falling edge of the second control signal concurrently with the first set of one or more control switches delivering the falling edge of the first control signal.

* * * * *